(12) United States Patent
Cairns et al.

(10) Patent No.: US 6,249,168 B1
(45) Date of Patent: Jun. 19, 2001

(54) CLOCK PULSE GENERATOR

(75) Inventors: Graham A. Cairns, Cutteslowe; Michael J. Brownlow, Sandford on Thames, both of (GB)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/426,607

(22) Filed: Oct. 26, 1999

(30) Foreign Application Priority Data

Oct. 27, 1998 (GB) .................................................. 9823369

(51) Int. Cl.[7] ........................................................ G06F 1/04
(52) U.S. Cl. .......................... 327/295; 327/296; 327/172; 377/77
(58) Field of Search .................................... 327/291, 295, 327/296, 297, 172, 175, 299, 258, 259; 326/93, 95, 96, 97, 98; 377/64, 75, 76, 77, 78, 79

(56) References Cited

U.S. PATENT DOCUMENTS

| | | | |
|---|---|---|---|
| 4,542,301 * | 9/1985 | Narabu | 327/160 |
| 4,746,915 * | 5/1988 | Sekiya | 340/719 |
| 5,136,622 * | 8/1992 | Plus | 377/64 |
| 5,335,254 * | 8/1994 | Tu et al. | 377/76 |
| 5,434,899 * | 7/1995 | Huq et al. | 377/78 |
| 5,859,630 * | 1/1999 | Huq | 345/100 |

* cited by examiner

Primary Examiner—Timothy P. Callahan
Assistant Examiner—Hai L. Nguyen
(74) Attorney, Agent, or Firm—Renner, Otto, Boisselle & Sklar, LLP

(57) ABSTRACT

A clock signal generator comprises a clock input CK and N stages where N is greater than three. Each of the stages comprises a transmission gate M3, M4 which passes clock pulses from the clock Input CK in response to a control signal a from the preceding stage. A control signal generating circuit M5, M6, D7, M8 supplies a control signal e to the succeeding stage when the control signal a from the preceding stage and the clock pulse from the transmission gate M3, M4 have ended. The control signal generating circuit M5, M6, D7, M8 ends the control signal e when the succeeding stage produces its control signal F.

21 Claims, 17 Drawing Sheets

CLOCK PULSE GENERATOR

BACKGROUND OF THE INVENTION

1. Field of the Invention

The present invention relates to a clock pulse generator. Such a generator may be used in high speed low power controller circuits, for instance in complex very large scale integrated (VLSI) designs including digital signal processing (DSP). The clock pulse generator may advantageously be used in addressing for driver circuits of spatial light modulators and displays, for example of the pixelated matrix type in which a sequence of well-defined pulses must be supplied to circuits which sample high speed video data.

2. Description of the Related Art

A known type of clock pulse generator is based on a shift register. The shift register comprises a cascaded chain of D-type flip-flops which respond to clock pulses to pass a mingle stored logic state from one flip-flop to the next in the chain. For a typical clock pulse generation application, all but one of the states of the flip-flops are initialised to a logic low (0) state whereas the remaining flip-flop is initialised to a logic high (1) state. The shift register is clocked at a known frequency and the circulating one state within the shift register is used to generate sequential pulses at the outputs of the flip-flops. This well-known technique is disclosed, for example, in U.S. Pat. No. 4,542,301 and U.S. Pat. No. 4,612,659. An improvement to this technique is disclosed in U.S. Pat. No. 4,785,297. In this case, the "master" and "slave" outputs of each of the flip-flops are used in conjunction with combinational logic gates, such as AND or NAND gates, to reduce the clocking speed of the shift register for a given number of output pulses.

It is also well-known to form clock pulse generating circuits from chained D-type latch circuits. FIG. 1 of the accompanying drawings illustrates part of a typical CMOS circuit comprising latches 1 and 2. The construction and operation of such an arrangement is well-known and will not be described in detail. Consecutive latches such as 1 and 2 are transparent on opposite clock phases of a two phase clock represented by CK and CK–. The input and output of each latch are "NANDed" together in order to produce the clock pulses Nn and Np as illustrated in FIG. 2 of the accompanying drawings. FIG. 2 also illustrates the two phase clock waveforms, the D input to the first latch 1, the output M of the first latch 1 which is also the input of the second latch 2, and the output Q of the second latch 2.

This arrangement has several disadvantages. In particular, a two phase clock is required to drive the shift register. Also, each clock line drives two transistor gates in each of the latches 1, 2. This presents a relatively high capacitive loading to each clock phase and limits the maximum frequency of operation. Further, the output pulses Nn and Np cannot be guaranteed to be non-overlapping. This can cause problems in certain applications, for example when the output pulses are used for sampling video data in pixel matrix display drivers.

Various techniques have been disclosed for reducing the capacitive loading of the clock line or lines so as to increase the maximum frequency of operation and reduce clock power consumption For example, state-controlled clocking techniques have been suggested for use in clock pulse generating circuits. An example of this is disclosed in U.S. Pat. No. 4,746,915, in which the shift register is divided into several sub-registers of flip-flops or latches and another shift register operating at a lower frequency is used selectively to apply the clock signal to each sub-register.

For applications in which the requirement is for a single circulating 1 state, only those flip-flops or latches containing a 1 state or having a 1 state at their input require clocking. As shown in FIG. 3, for such applications, the signal generated by "ORing" the input and output of each flip-flop can be used to gate the clock signals supplied to the clock input of the flip-flop. Such an arrangement is disclosed in T. Maekawa et al, "A 1.35-in.-diagonal wide-aspect-ratio poly-Si TFT LCD with 513 k pixels" Journal of the Society or Information Display, pp 415–417, 1994. However, such an arrangement requires aa full flip-flop and several further transistors per stage. Also, the flip-flop outputs have to drive a relatively large load and this limits-the maximum speed of operation.

SUMMARY OF THE INVENTION

According to a first aspect of the invention, there is provided a clock signal generator comprising a cloak input and N stages where N is greater than three, each with one of the stages comprising a transmission gate arranged to pass a clock pulse from the clock input to an output of the transmission gate in response to a control signal from the (i−1)th stage and a control signal generating circuit for supplying a control signal to the (i+1)th stage when the control signal from the (i−1)th stage and the clock pulse from the transmission gate have ended and for ending the control signal to the (i+1)th stage when the (i+1)th stage produces a control signal, where $1 < i < N$.

Each ith stage may comprise a switching arrangement for selectively causing the transmission gate to be controlled by a control signal from the (i+1)th stage and the control signal generating circuit to supply the control signal to the (i−1)th stage when the control signal from the (i+1)th stage and the clock pulse from the transmission gate have ended and to end the control signal to the (i−1)th when the (i−1)th stage produces a control signal. The switching arrangement may comprise a plurality of further transmission gates connected to the output of the control signal generating circuit and having control inputs for receiving direction control signals.

The transmission gate outputs may constitute outputs of the generator.

At least one of the control signals or the complements thereof may constitute output signals of the clock pulse generator.

The transmission gates may have inputs connected to the clock input.

Each of the transmission gates may comprise first and second metal-oxide-silicon field effect transistors of opposite conductivity types whose source-drain paths are connected in antiparallel The gate of the second transistor may be connected to the output of an inverter whose input is connected to the gate of the first transistor for receiving the control pulse.

The control signal generating circuit of each ith stage may comprise third, fourth and fifth metal-oxide-silicon field effect transistors and a metal-oxide-silicon field effect transistor arrangement, the third and fourth transistors being of opposite conductivity types and being connected in series between first and second supply inputs with the gate of the third transistor being connected to the control signal generating circuit of the (i−1)th stage and the gate of the fourth transistor being connected to the output of the transmission gate, the fifth transistor and the transiltor arrangement being of opposite conductivity types and being connected in series between the first and second supply inputs with the gate of the fifth transistor being connected to the control signal generating circuit of the (i+1)th stage, a first control electrode of the transistor arrangement being connected to the connection between the third and fourth transistors, and the second control electrode of the transistor arrangement being connected to the output of the transmission gate.

The gate of the fourth transistor and the second control electrode of the transistor arrangement may be connected to the output of the transmission gate via an inverter.

The transmission gate outputs maybe provided with pull-up or pull-down transistors. Each of the pull-up or pull-down transistors may have a control electrode connected to the input or output of the inverter.

Each of the stages may have a control signal input for receiving the control signal from the preceding stage, the control signal input being provided with a pull-up or pull-down arrangement. Each of the pull-up or pull-down arrangements may comprise a transistor arrangement having a first control electrode connected to the output of the inverter and a second control electrode connected to the output of the inverter of the preceding stage.

Each of the stages may have a resetting circuit for resetting the stage in response to a reset signal. Each of the stages may have a control signal input for receiving the control signal from the preceding stage and the resetting circuit may comprise a pull-up or pull-down transistor connected to the control signal input for resetting the logic state thereat.

The generator may comprise a CMOS integrated circuit.

According to a second aspect of the invention, there is provided a spatial light modulator comprising a clock pulse generator according to the first aspect of the invention.

The modulator may comprise a liquid crystal device.

According to a third aspect of the invention, there is provided a display comprising a modulator according to the second aspect of the invention.

It is thus possible to provide a clock pulse generator having a very high maximum frequency of operation. In particular, it is possible to provide a generator in which the clock pulses are required to charge only one transistor gate at a time (in addition to any external load when the transmission gate outputs constitute the outputs of the generator). Also, the clock signal can be fully gated. This is important for two reasons. Firstly, transistor loading of the clock signal limits its rise and fall times and hence the maximum frequency. With the present arrangement, loading of the clock is mainly due to parasitic elements so that high speed can be maintained for relatively large clock pulse generators.

Secondly, the capacitive loading of the clock signal by transistor gates can be minimised. In particular, apart from charging only one gate per stage, only the gates of transistors in stages which are in their switching state are charged. This results in reduced power consumption and, in particular, in lower power dissipation in the track resistance of circuit tracks carrying the clock signal.

Only a single phase clock is required and the output pulses may be exact copies of the clock signal (degraded only by passage through the transmission gates). The transmission gates may be made relatively large so that the drive capability is high. The output pulses when taken from the transmission gates are guaranteed to be non-overlapping. The clock pulse generator may be arranged for dynamic operation, partially static operation or pseudo-static operation. Although the highest operating speed is attained with dynamic operation, partially static or pseudo-static operation may be more practical for larger circuits.

The following useful signals may be generated from the stages:

(i) Independent non-overlapping positive (or negative) pulses of duration substantially equal to the clock pulse high (or low) period and synchronised with the clock rising (or falling) edge;

(ii) Independent overlapping positive and negative pulses of duration substantially equal to the clock period and synchronized to the clock falling (or rising) edge;

The pulse widths may be changed merely by changing the mark-to-space ratio of the clock signal used to drive the clock pulse generator.

BRIEF DESCRIPTION OF THE DRAWINGS

The invention will be further described, by way of example, with reference to the accompanying drawings, in which.

Like reference numerals refer to light parts throughout the drawings.

DESCRIPTION OF THE PREFERRED EMBODIMENTS

Figure 1:
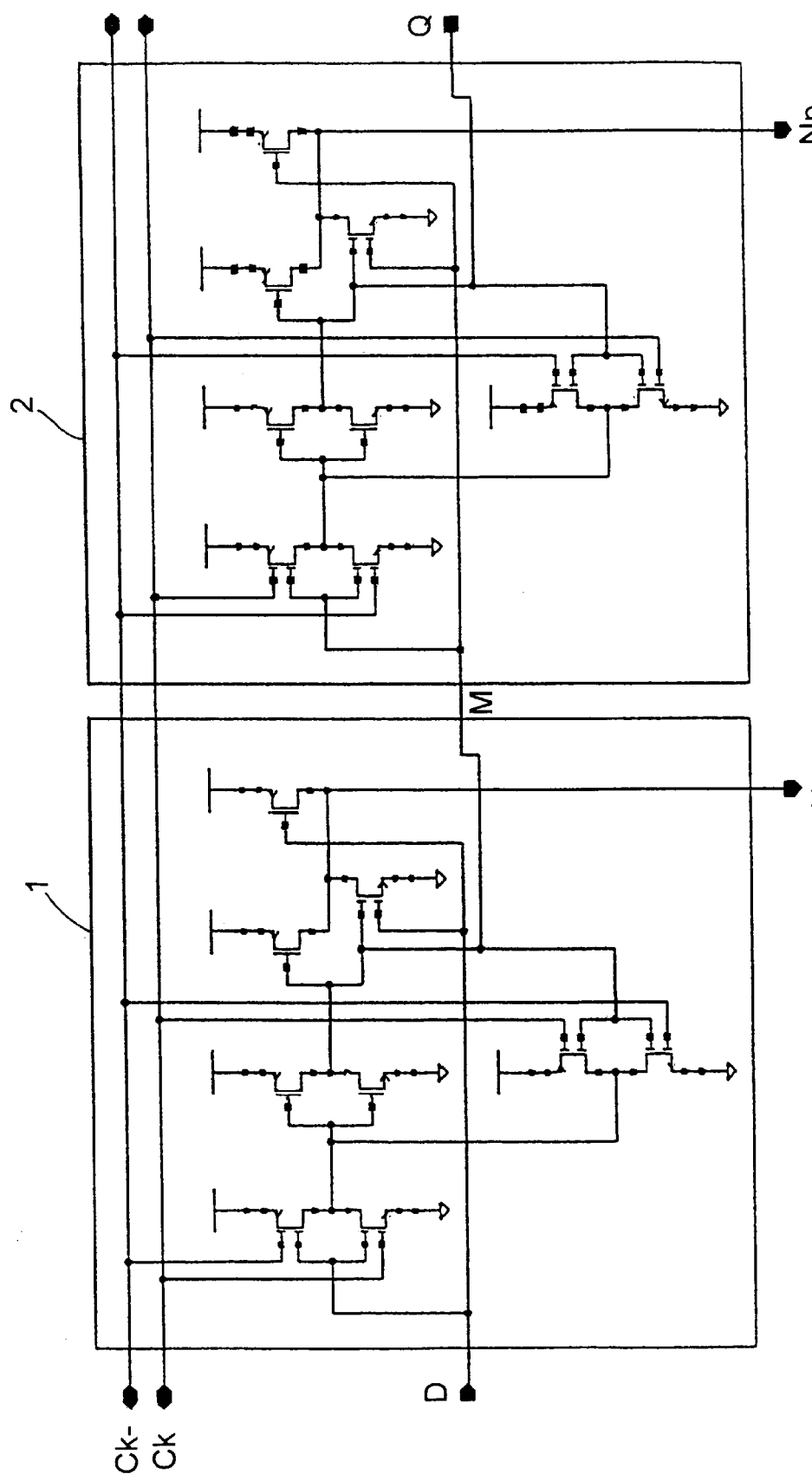
FIG. 1 is a circuit diagram of two stages of a known type of shift register.
Figure 2:
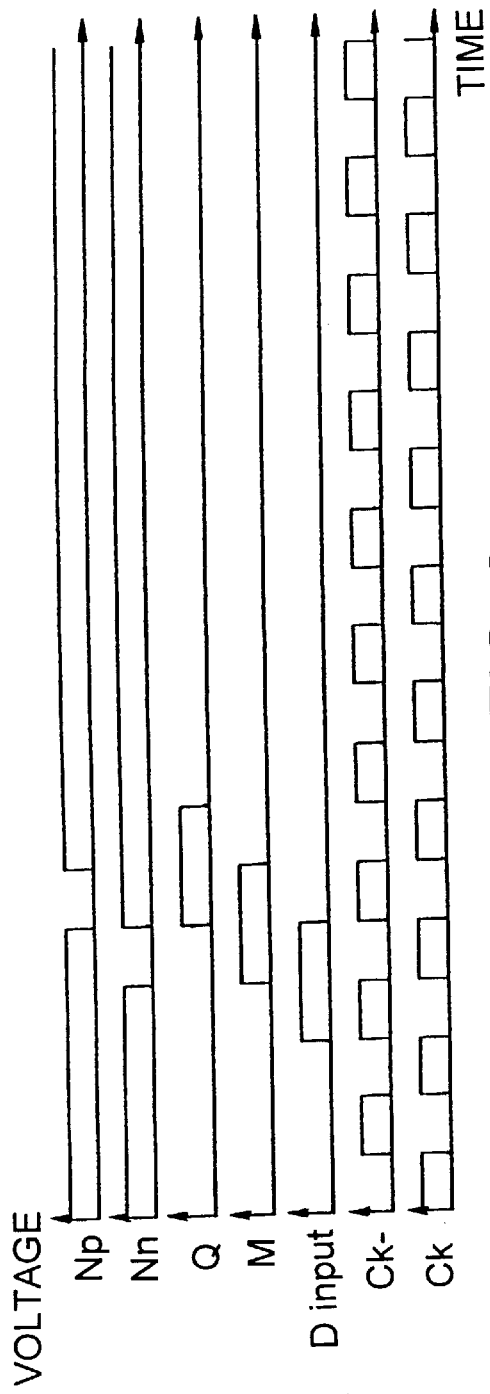
FIG. 2 is a diagram illustrating waveforms occurring in the stages shown in FIG. 1.
Figure 3:
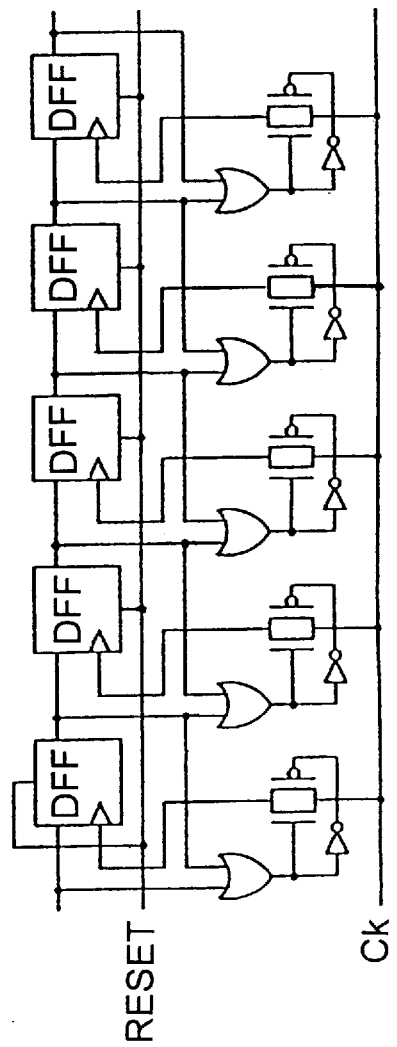
FIG. 3 is a block circuit diagram of a known type of clock pulse generator.
Figure 4:
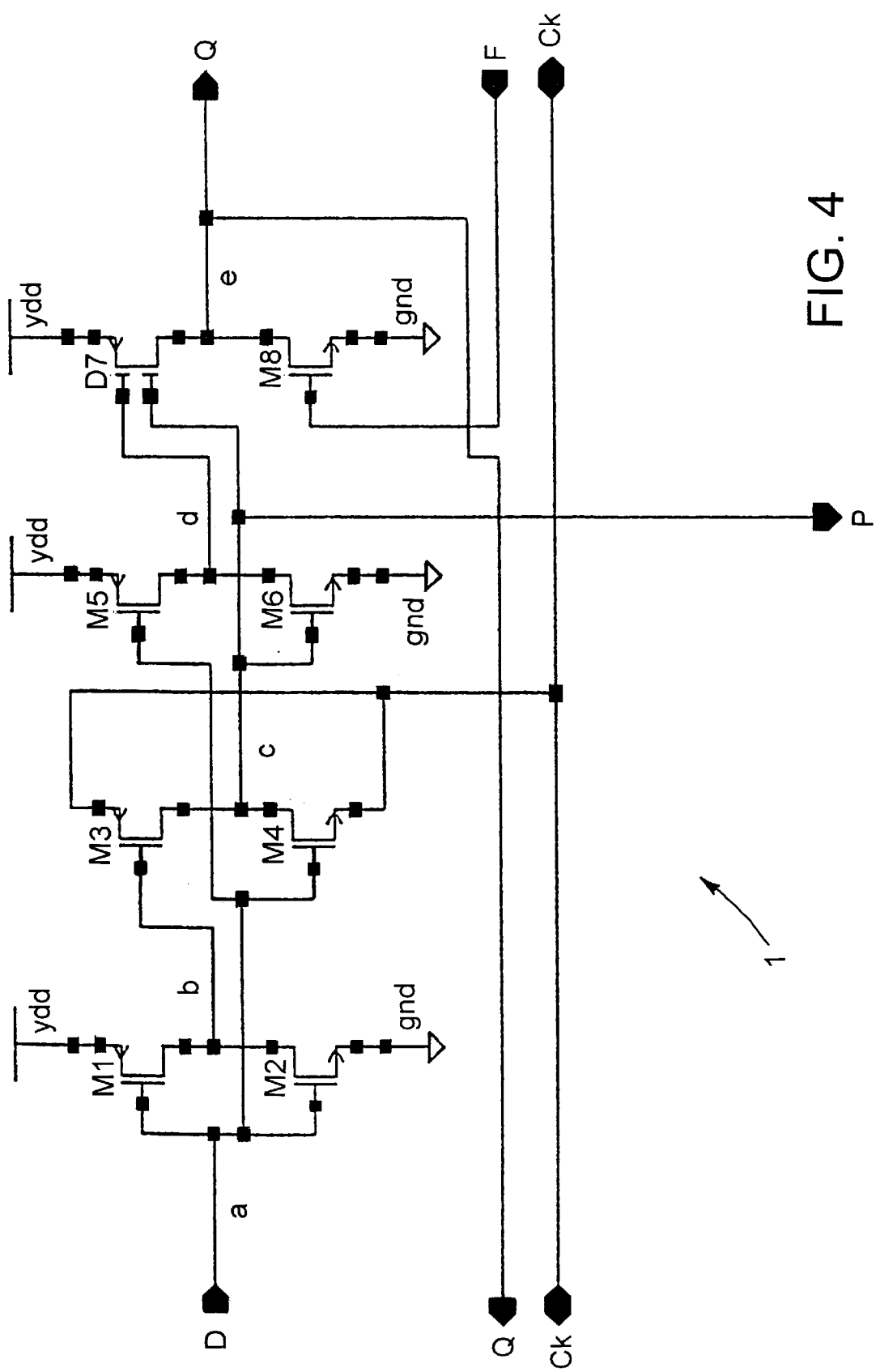
FIG. 4 is a circuit diagram of one stage of a dynamic clock pulse generator constituting an embodiment of the invention.

The clock pulse generator stage 1 shown in FIG. 4 comprises P-type metal-oxide-silicon transistors M1, M3, M5 and D7 and N-type metal-oxide-silicon transistors M2, M4, M6 and M8. The generator is embodied as or as part of a CMOS large scale integrated circuit. Various circuit nodes (and the waveforms appearing at these nodes) are denoted by a to e.

The stage 1 has a control signal input D which receives a control signal a from the preceding stage. The input D is connected to the gates of the transistors M1 and M2 which are connected in series between supply lines vdd and gnd to form an inverter. The transistors M3 and M4 have their source-drain paths connected in antiparallel to form a transmission gate. The gate of the transistor M4 receives the control signal a whereas the gate of the transistor M3 receives the output signal b from the inverter. The input of the transmission gate is connected to a clock line for receiving the clock signals CK from an external single phase clock (not shown).

The output of the transmission gate supplies signals c to a control signal generating circuit comprising the transistors M5, M6, D7 and M8. The signals c are also supplied as output signals P of the stage 1. The transistors M5 and M6 are connected in series between the supply lines vdd and gnd. The gate of the transistor M5 receives the control signals a from the preceding stage whereas the gate of the transistor M6 receives the signal c from the transmission gate. The transistor D7, which is shown as a dual gate transistor but which may be embodied as single gate transistors with their source-drain paths connected in series, is connected in series with the transistor M8 between the supply lines vdd and gnd. The first gate of the transistor D7 is connected at the circuit node d to the drains of the transistors M5 and M6. The second gate of the transistor D7 is connected to the output of the transmission gate so as to receive the signals c. The drains of the transistors D7 and M8 are connected together at a circuit node e and to the output Q of the stage for supplying control signals e to the succeeding stage. The gate of the transistor M8 is connected via a circuit node F to receive the control signals produced by the control signal generating circuit of the succeeding stage. The signals e are likewise fed back to the preceding stage.

Although the transistor D7 is shown as a dual gate transistor, it may be replaced by two single gate transistors connected in series.

Figure 5:
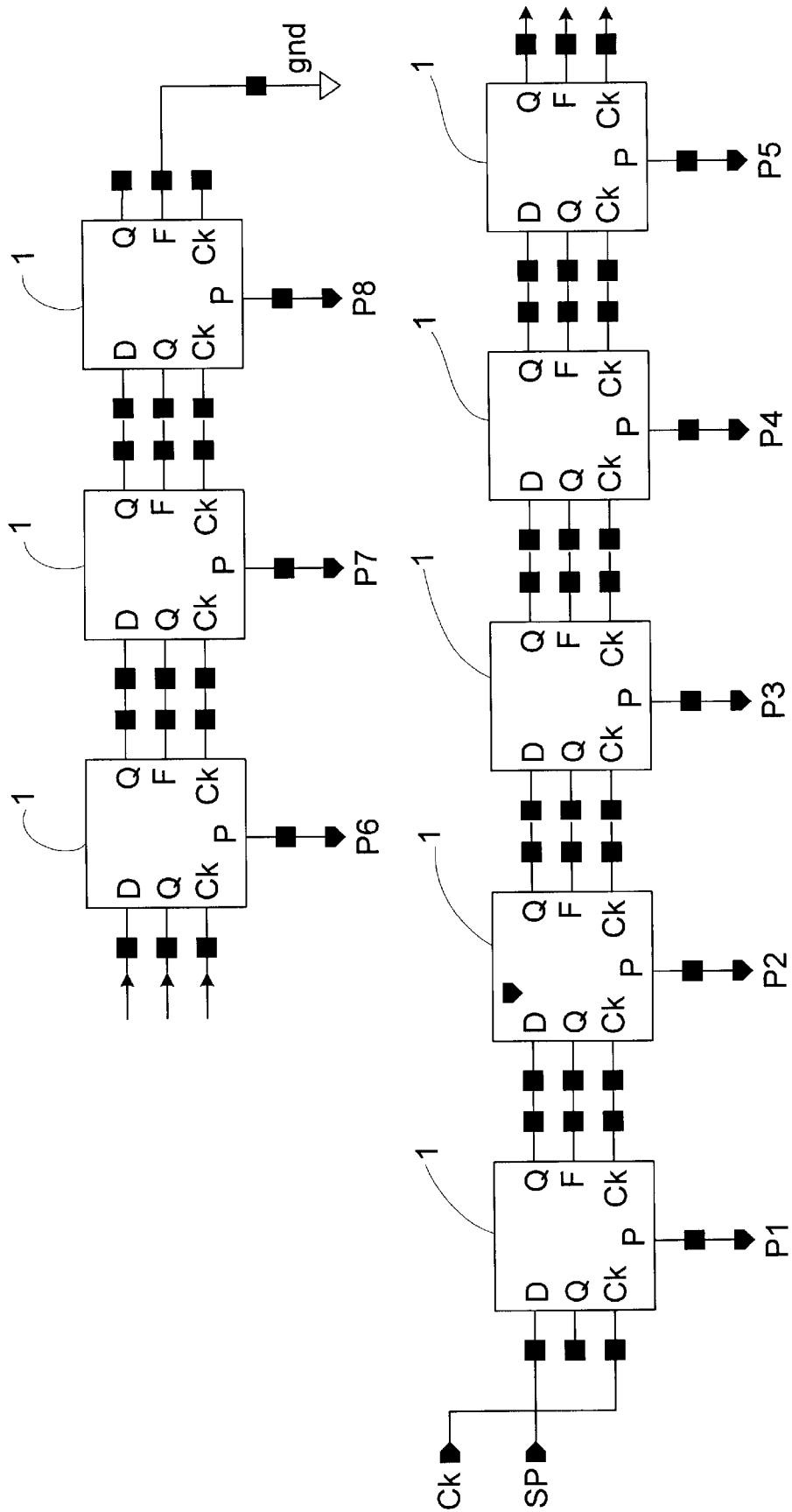
FIG. 5 is a block diagram of the clock pulse generator one of whose stages is illustrated in FIG. 4.

FIG. 5 illustrates how the stages 1 are connected together so as to form the complete clock pulse generator. The generator comprises eight such stages and the interconnections between consecutive stages are illustrated using the same reference numerals as in FIG. 4. The outputs P are given subscripts representing the position of the stages in the clock pulse generator. A start pulse SP is supplied to the input D of the first stage whereas the output Q of the last stage is unconnected. The input F of the last stage is connected to the supply line gnd.

Figure 6:
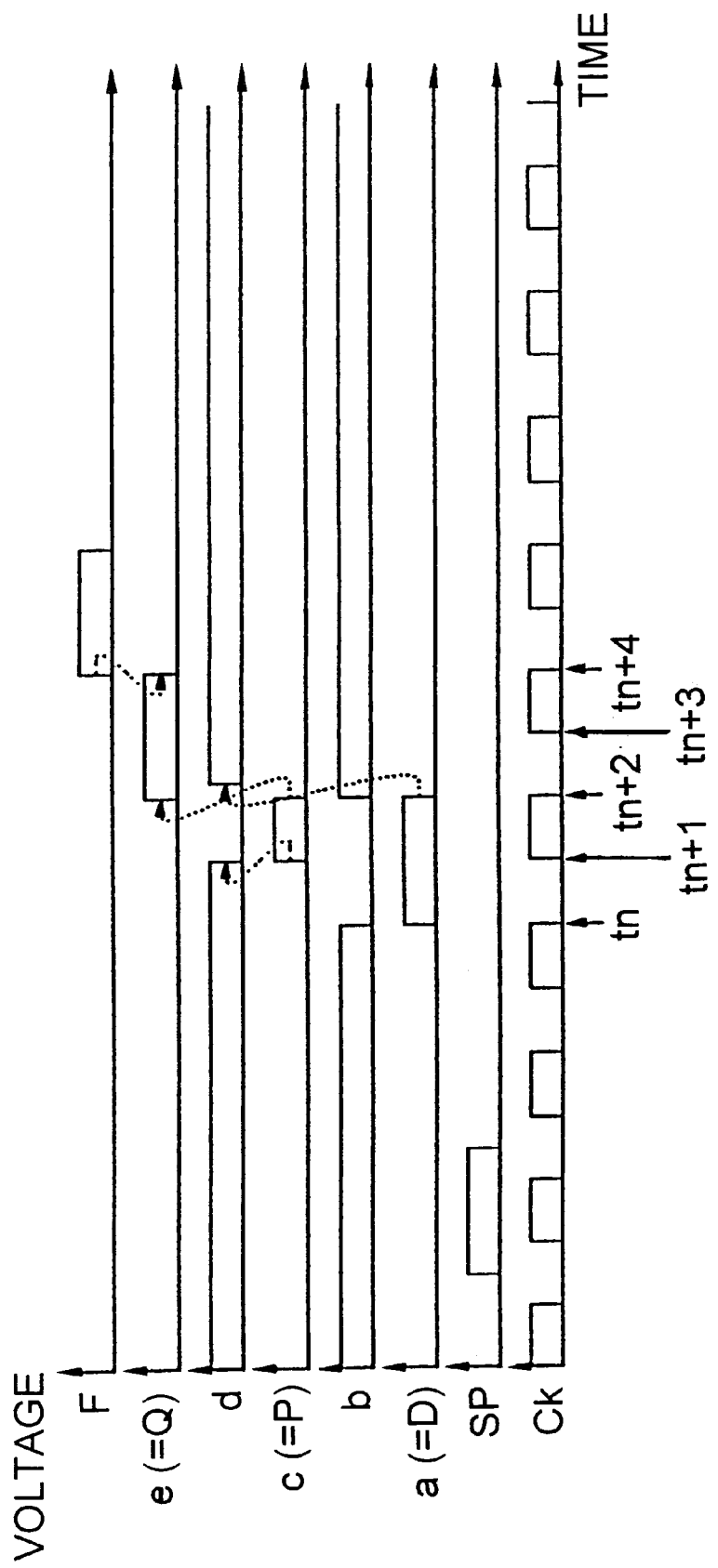
FIG. 6 is a diagram illustrating waveforms occurring in the clock pulse generator shown in FIGS. 4 and 5.

FIG. 6 illustrates the start pulse SP and the clock pulses CK together with the various waveforms occurring in the fourth stage 1. The initial conditions of the fourth stage are such that the signals b and d are high whereas the signals a, c, e and F are low.

At time tn, the signal a supplied by the preceding stage goes high so that the output of the inverter formed by the transistors M1 and M2 goes low. The transmission gate formed by the transistors M3 and M4 is turned on so that the signal c becomes the clock signal. The clock signal is low between times tn and tn+1 so that the signal c remains low until tn+1.

At time tn+1, the clock signal CK goes high so that the signal c follows and the transistor M6 discharges the node d so that the signal d goes low. Although one of the gates of the transistor D7 is pulled low, the other is connected to the circuit node c and remains high until the clock signal passed through the transmission gate falls. Thus, the signal e remains low until time tn+2.

At time tn+2, the clock signal goes low and the signal c follows. Both gates of the transistor D7 are now low so that the node e is pulled high. The signal e is the control signal for the next stage and is an exact phase-delayed replica of the signal a. The signal e is fed back to the equivalent of the transistor M8 of the preceding stage and causes the control signal a to go low. As a result of this, the circuit nodes b and d are returned to their high states.

At time tn+4, the signal F generated in the following stage turns on the transistor M8. The control signal e goes low and switches off the transmission gate in the succeeding stage.

Figure 7:
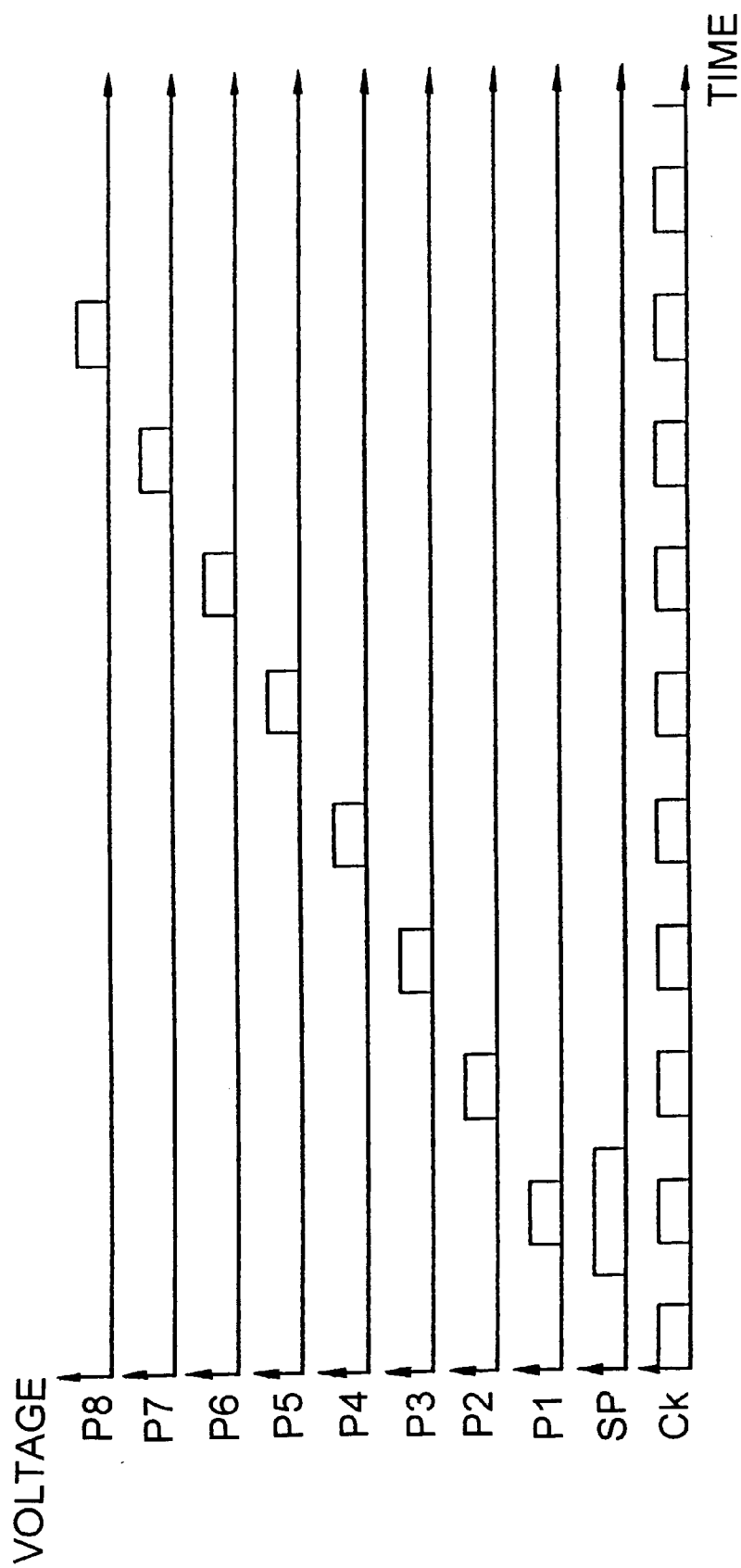
FIG. 7 is a diagram illustrating waveforms occurring in the clock pulse generator of FIG. 5.
Figure 8:
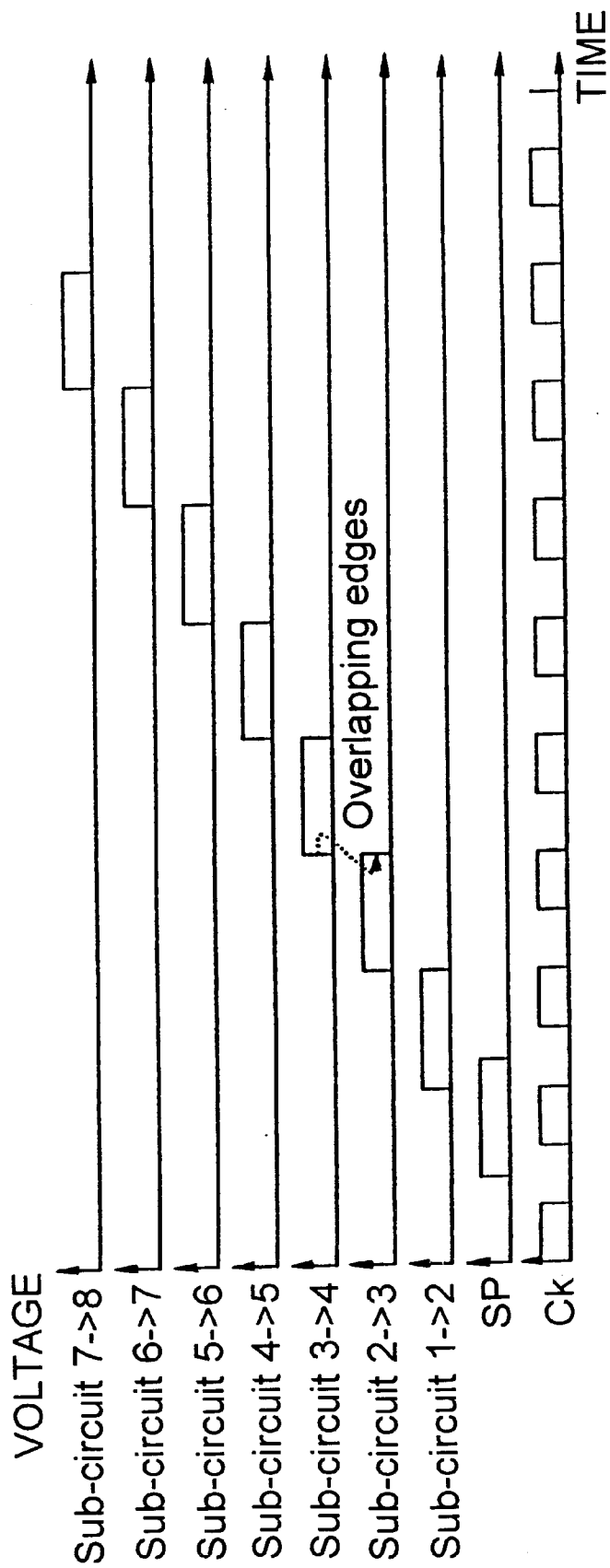
FIG. 8 is a diagram illustrating further waveforms occurring in the clock pulse generator of FIG. 5.

FIG. 7 illustrates the complete set of outputs P1 to P8 of the clock pulse generator of FIG. 5 together with the start pulse SP and clock signal CK. The output signals are successive non-overlapping positive pulses copied from the clock signal "high phase" and delayed by a single transmission gate. In addition to the gated clock pulses P1 to P8, the control signals a and e may be supplied as outputs from the clock pulse generator. These signals are illustrated in FIG. 8 and their complements may also be made available as the outputs of the inverters in the stages 1. These signals overlap each other (as indicated by the arrowed broken lines in the waveform drawings) so that longer or shorter duration pulses may be generated using combinational logic.

The initial conditioned of several of the nodes in the stage shown in FIG. 4 have to be forced in order for the circuit to work correctly. This may be achieved by scaling the relative sizes of the transistors so as to force the quiescent balance points of the N-type and P-type drain connections. Alternatively, resetting devices may be provided as described hereinafter. However, because of the dynamic circuit operation of this embodiment, the nodes are susceptible to drifting as a result of transistor current leakage and capacitive injection. This may result in unclean signals with reduced noise margins. To prevent this occurring, partially static or pseudo-static operation as described hereinafter may be adopted.

Figure 9:
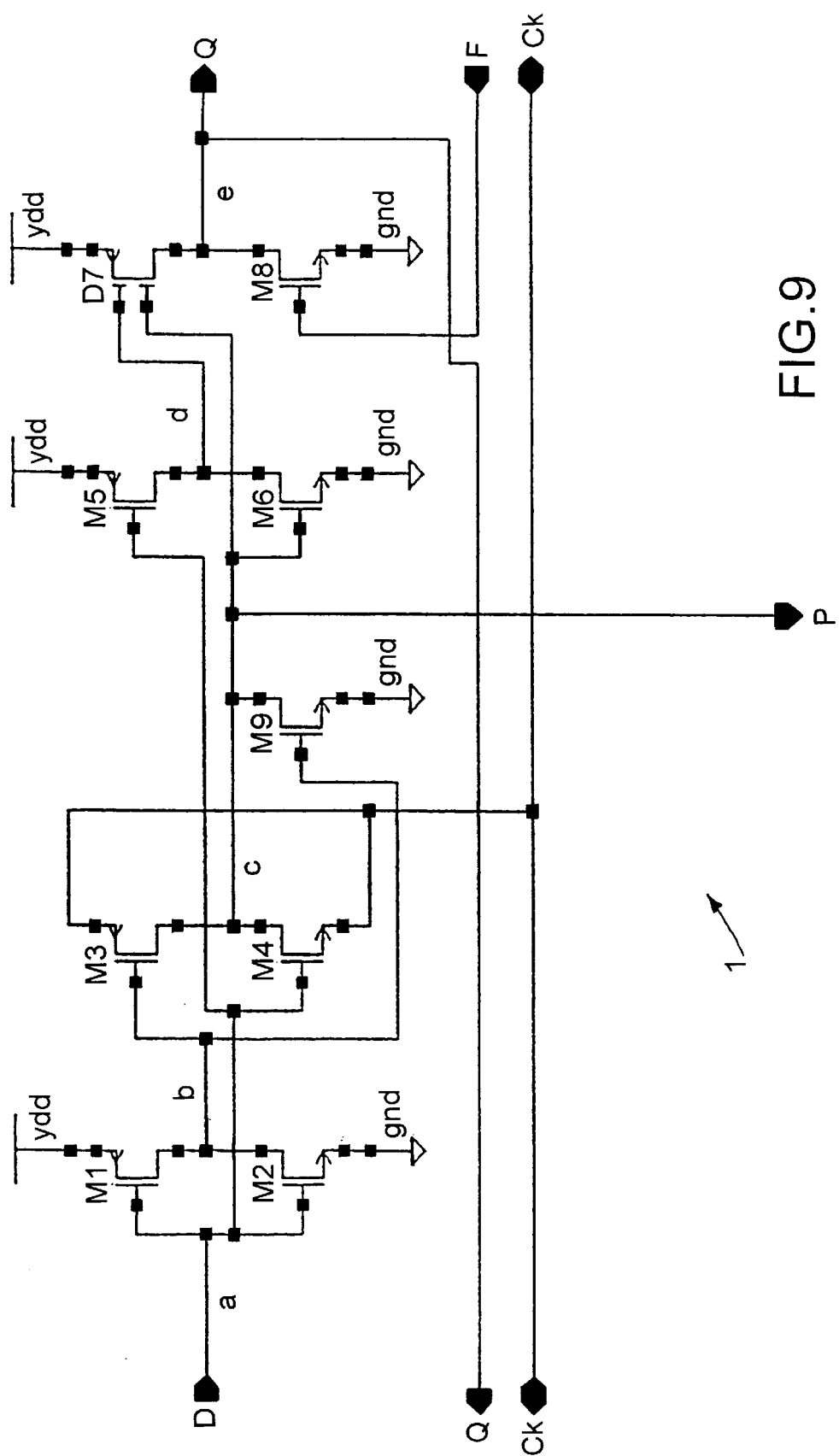
FIG. 9 is a circuit diagram of one stage of a partially static clock pulse generator constituting an embodiment of the invention.

The clock pulse generator stage 1 shown in FIG. 9 differs from that shown in FIG. 4 in that it is partially static. In particular, an N-type pull-down transistor M9 is connected between the output of the transmission gate and the supply line gnd with its gate connected to the output of the inverter. The transistor M9 ensures that the output signal P is pulled low when the control signal a is at its low level. Thus, the output signal P is either fixed to its correct default value or follows the clock signal. The waveforms occurring in the stage 1 are as shown in FIGS. 6, 7 and 8.

Figure 10:
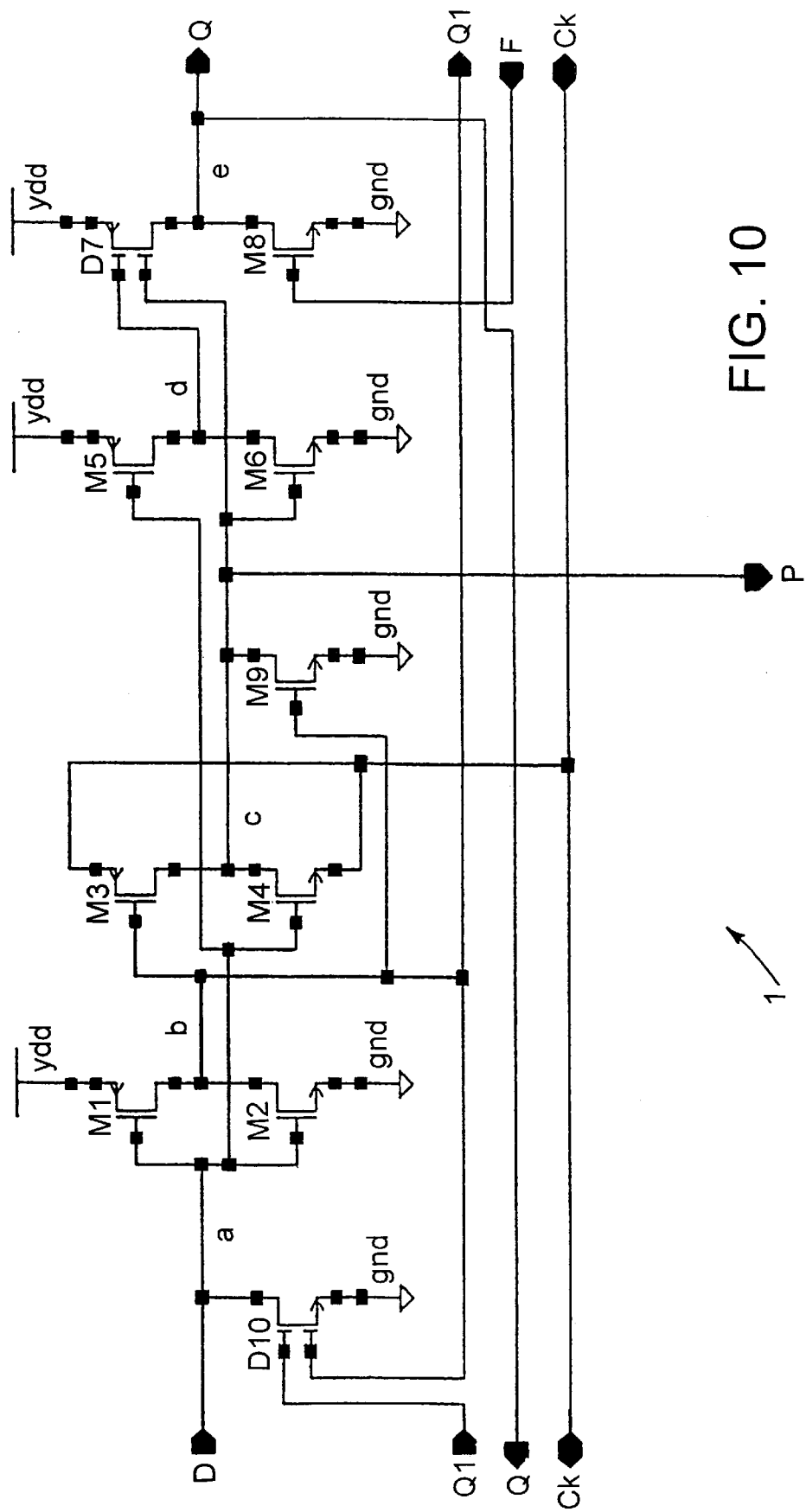
FIG. 10 is a circuit diagram of one stage of a pseudo-static clock pulse generator constituting an embodiment of the invention.

The clock pulse generator stage 1 shown in FIG. 10 is pseudo-static and differs from that shown in FIG. 9 in that a dual gate transistor D10 is connected between the input D and the supply line gnd. Alternatively, the dual gate transistor D10 may be replaced by two discrete single gate transistors. The first gate of the transistor D10 is connected at a circuit node D1 to the output of the inverter of the preceding stage whereas the second gate is connected to the circuit node b to receive the output of the inverter of the stage shown in FIG. 10.

The default state of the inverter comprising the transistors M1 and M2 is with the input signal a low and the output signal b high. The signal b is fed back to the second gate of the transistor D10 so as to turn the second gate on. The default state of the output of the inverter in the preceding stage is high so that both gates of the transistor D10 are on. The inverter comprising the transistors M1 and M2 is thus locked in the low input/high output state. When the preceding stage becomes active, the signal from Its inverter supplied to the circuit node D1 goes low so that the first gate of the transistor D10 is switched off. One clock phase later when the signal a changes state, the inverter comprising the transistors M1 and M2 is unlocked and remains unlocked until the output signal b changes back to its default or high state. The lock is therefore open for two clock periods.

As described hereinbefore, all of the circuit nodes are actively switched (i.e. are static) when the stages are in their default states. However, when the stages are activated, the nodes a and e are momentarily floating and hencemomentarily dynamic. Accordingly, the terminology "pseudo-static" has been adopted to describe these stages.

Figure 11:
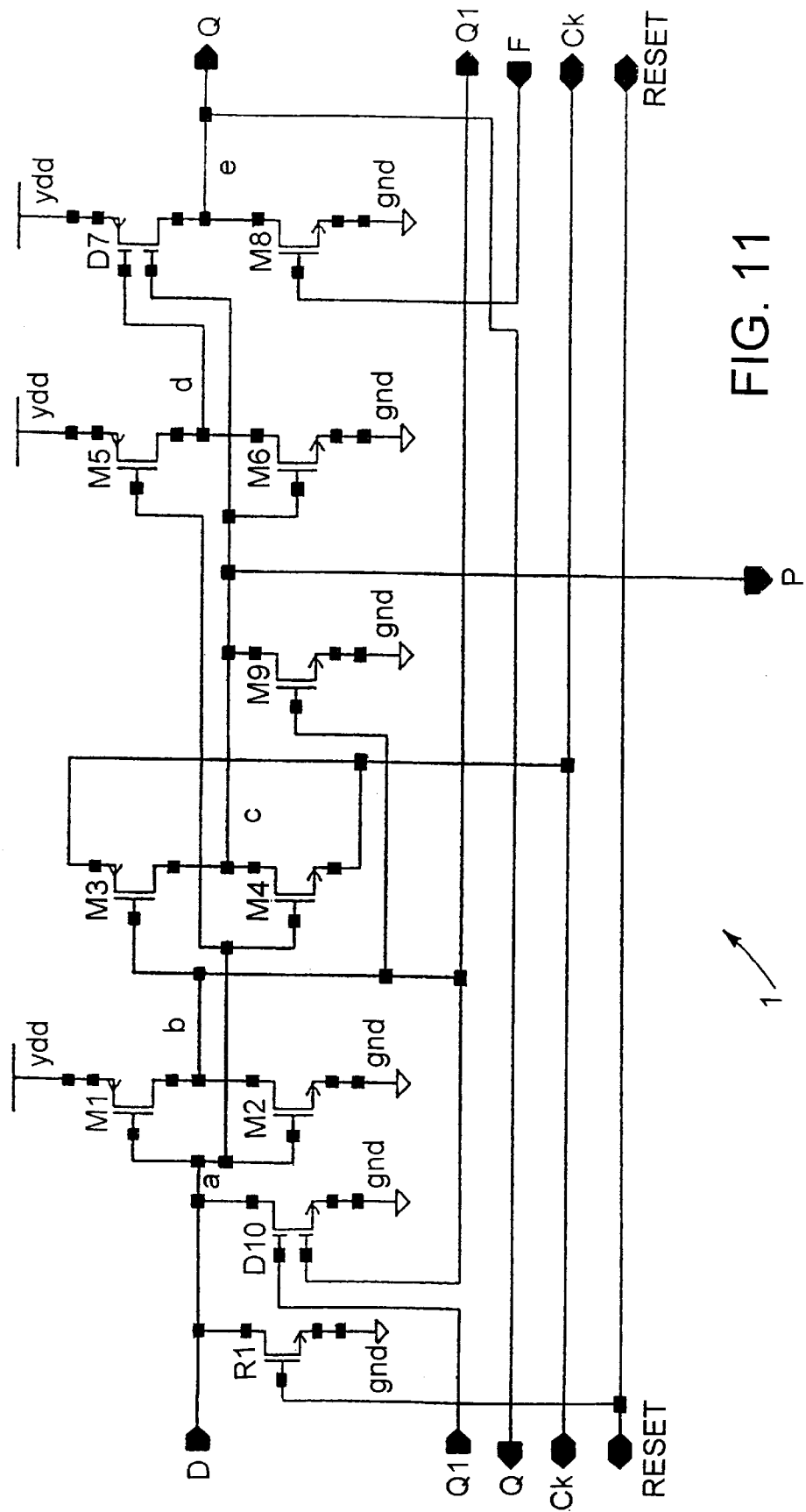
FIG. 11 is a circuit diagram showing the stage illustrated in FIG. 10 provided with a resetting arrangement.

As previously mentioned, careful initialisation by appropriate transistor scaling or using power-on reset techniques is required. However, it may be necessary to force some of the circuit nodes to their correct initial logic state by using an independent reset signal. An arrangement of this type is illustrated in FIG. 11, in which an initially high resetting signal RESET is supplied to the stages 1. The reset signal turns on a pull-down device in the form of a transistor R1 at the control signal input of the stage 1. The node a is therefore forced to the low state during initial resetting so that the nodes b to e are placed in there correct default logic states.

Figure 12:
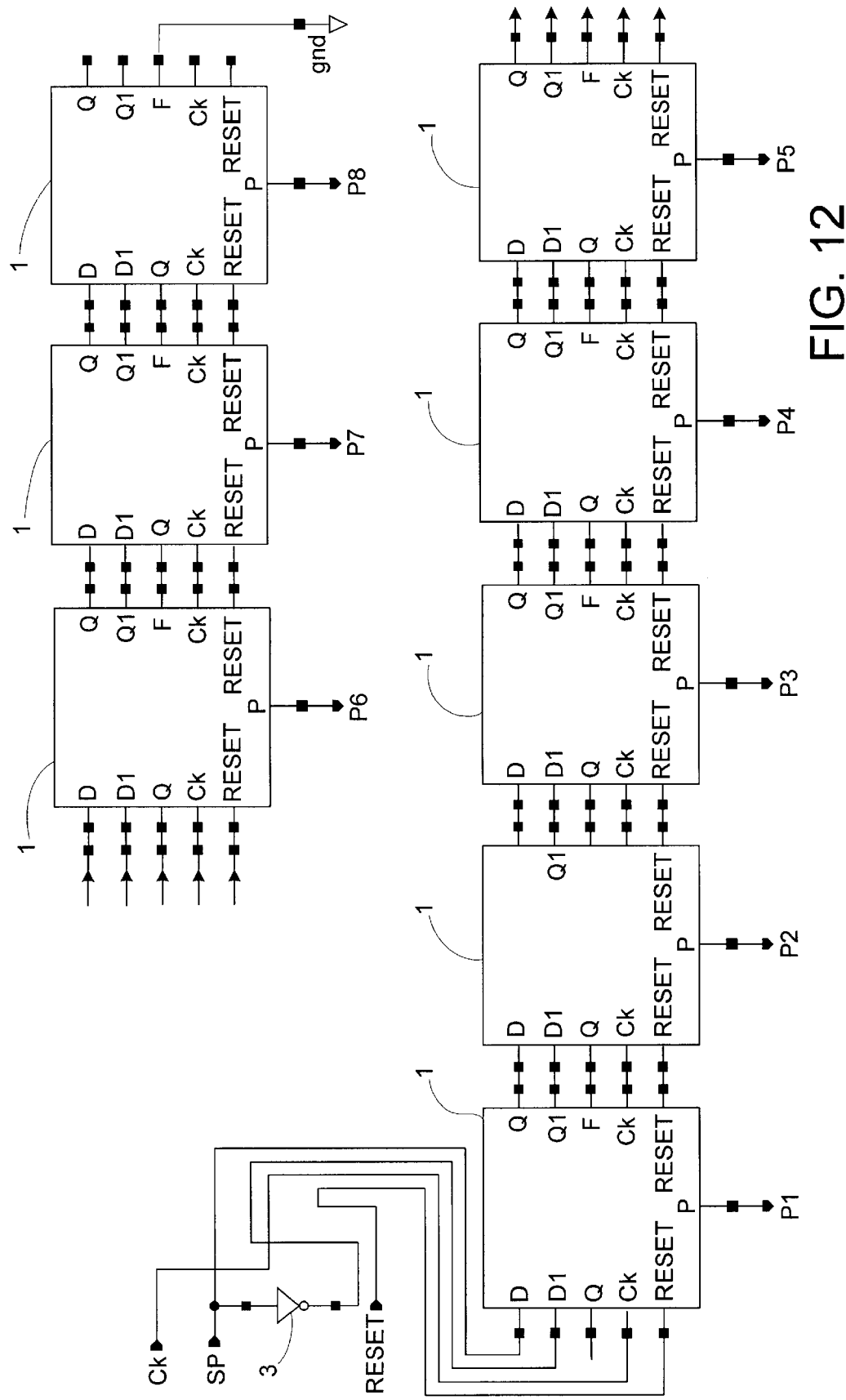
FIG. 12 is a block circuit diagram of the clock pulse generator one of whose stages is illustrated in FIG. 11.

FIG. 12 illustrates how the stages 1 are connected together so as to form the complete clock pulse generator. In order for correct operation, the input D1 of the first stage receives the inverse of the start pulse SP via an inverter 3. Again, the signals present during operation of the clock pulse generator illustrated in FIGS. 11 and 12 are as shown in FIGS. 6, 7 and 8.

Figure 13:
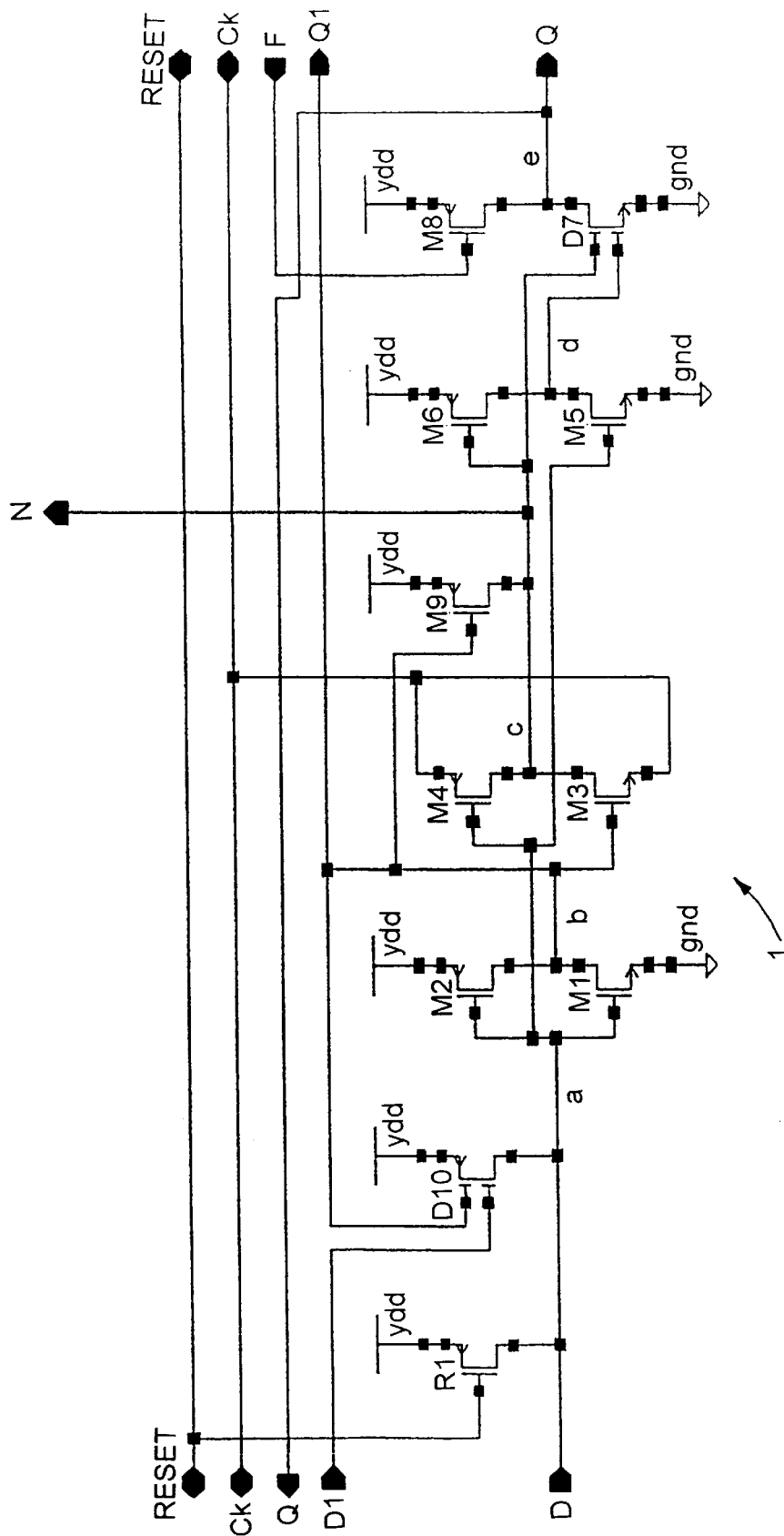
FIG. 13 is a circuit diagram of a complementary version of the stage shown in FIG. 11.

FIG. 13 shows a complementary circuit embodiment to that shown in FIG. 11. The circuit is substantially the same except that the transistore R1, M9 and D10 are arranged as pull-up devices; all of the transistors are of opposite conductivity types to the corresponding transistors of FIG. 11; and those transistors which are connected to the supply lines vdd and gnd are connected to opposite polarity supply lines compared with FIG. 11. Operation is similar to that of the stage of FIG. 11 but each stage generates a negative output pulse N and the RESET signal and the start pulse SP are "active low".

One of the limiting factors for high speed operation is the rate at which the node e can be switched by the dual gate transistor D7. The complementary embodiment illustrated in FIG. 13 uses an N-type dual gate transistor D7, which commonly has higher mobility that the equivalent P-type device and is therefore potentially faster.

Figure 14:
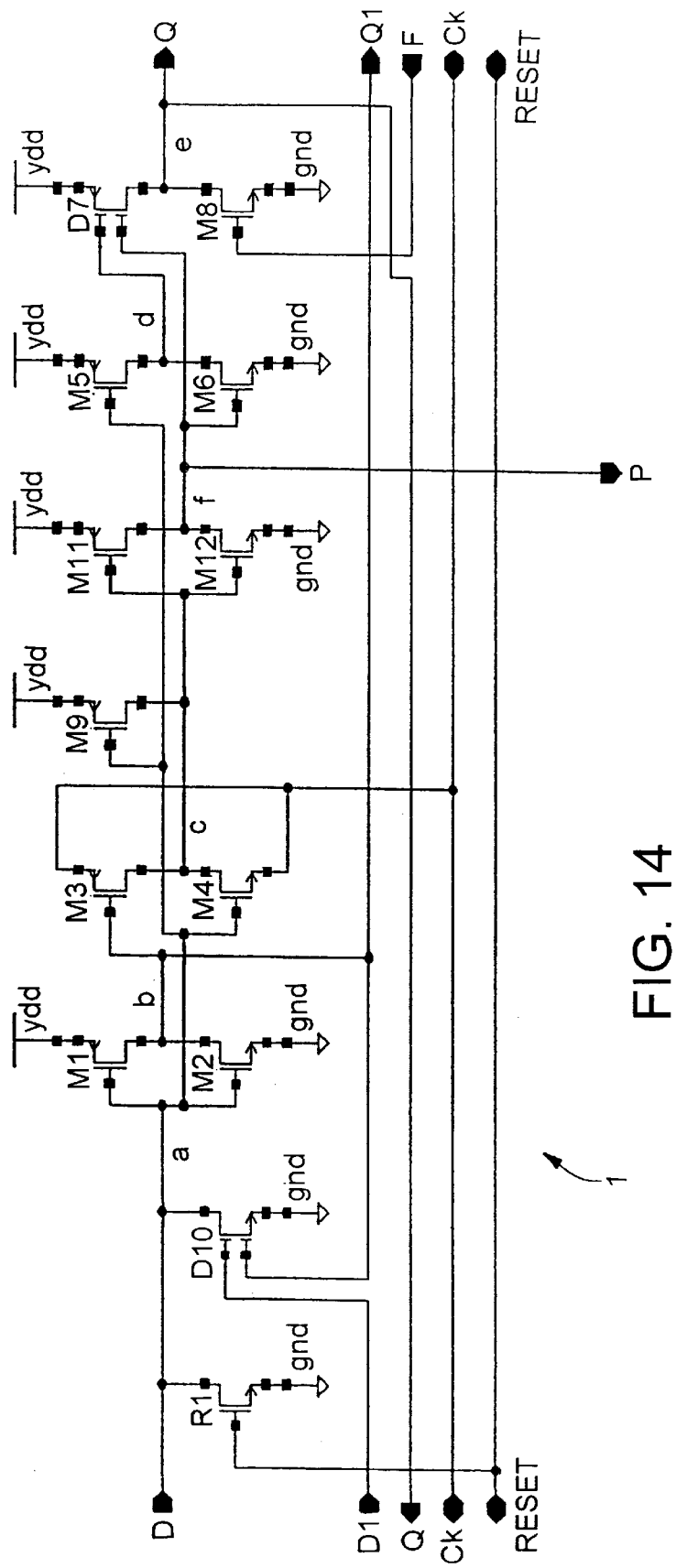
FIG. 14 is a circuit diagram of a stage of the type shown in FIG. 11 modified for more robust high speed operation.

FIG. 14 illustrates a clock pulse generator stage 1 which differs from that shown in FIG. 11 in that the transistor M9 comprises a pull-up device connected to the input of the inverter M1, M2 and the output of the transmission gate formed by the transistors M3 and M4 is connected via an inverter formed by transistors M11 and M12 to the gate of the transistor M6 and the second gate of the transistor D7. The presence of the inverter improves the robustness of the stage and, if correctly scaled, can increase the maximum frequency of operation. This to because one of the high-speed failure modes of the stage occurs if the control signal from the preceding stage allows more that one clock pulse to pass through the transmission gate. The Inverter formed by the transistors M11 and M12 filters out the second glitch pulse provided this pulse is small.

Figure 15:
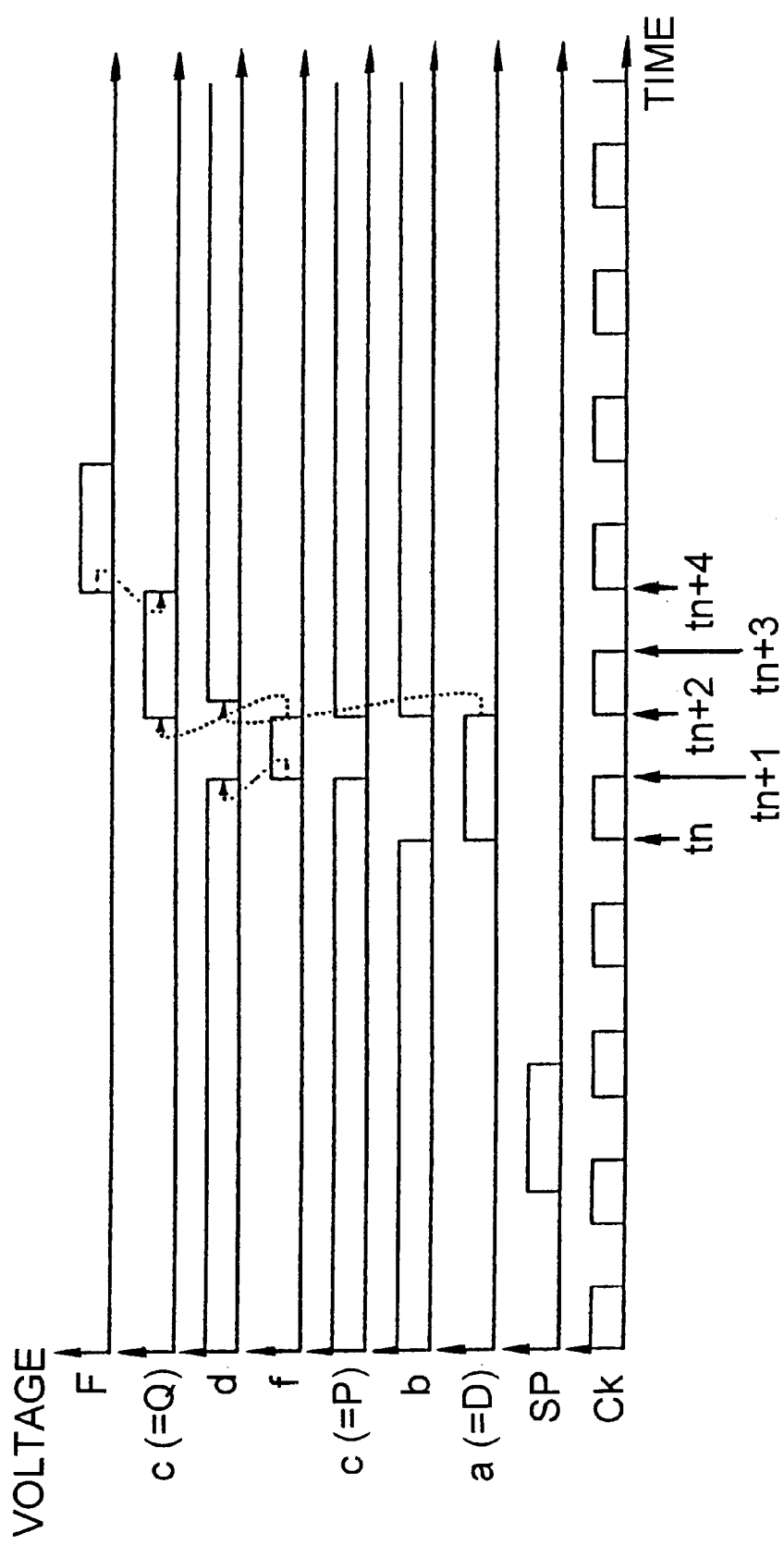
FIG. 15 is a diagram illustrating waveforms occurring in the clock pulse generator of FIG. 14.

FIG. 15 illustrates the start pulse SP and the clock pulses CK together with the various waveforms occurring in the fourth stage of a clock pulse generator comprising cascaded stages 1 of the type shown in FIG. 14. Although generally similar to the waveforms illustrated in FIG. 6, there are some differences. For example, the signal c is of opposite polarity and the signal f at the output of the inverter M11, M12 is additional. The phasing of all of the signals with respect to the clock pulses CK is different and a differently phased start pulse SP is required.

Figure 16:
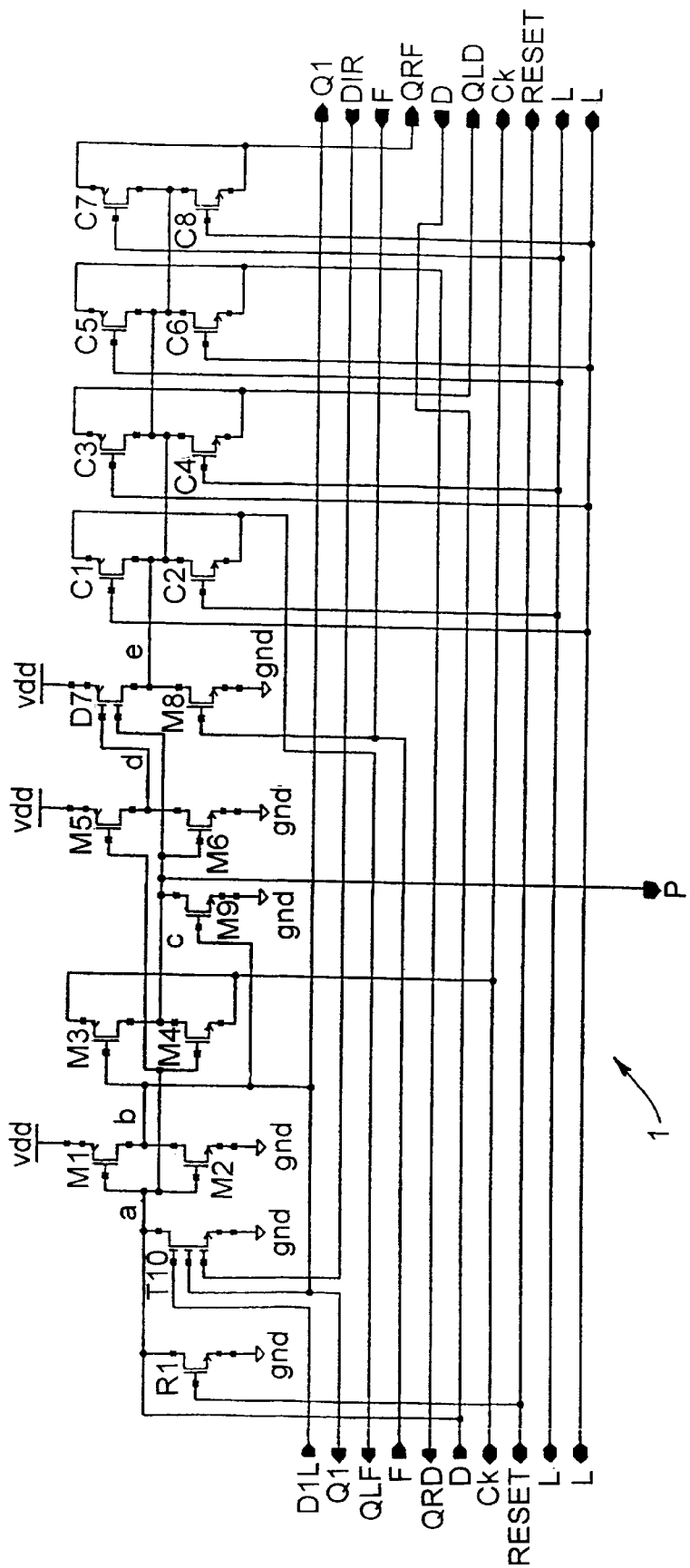
FIG. 16 is a circuit diagram of a stage of the type shown in FIG. 11 modified for operation in either direction.

The stage 1 shown in FIG. 16 differs from, that shown in FIG. 11 in that it is arranged to work in both directions. In other words, depending on direction control signals L and L-, the clock pulse generator may act as a shift register transferring the single logic high level from left to right or from right to left. This is achieved by the addition of transmission gates and by replacing the dual gate transistor D10 with a triple gate transistor T10 (or a dual gate transistor and a single gate transistor connected in series or three single gate transistors connected in series).

The stage 1 comprises transmissions gates formed by pairs of transistors G1 to G8. The gates of the transistor pairs are connected to the direction control lines L and L-. The inputs of the transmission gates are connected together to receive the gate control signal from the control signal generating circuit D7, M8. The output of the transmission gate G1, G2 is connected to a feedback output QLF for operation from right to left. The output of the transmission gate G3, G4 is connected to an output clock gate control a signal line QLD for operation from left to right. The output of the transmission gate G5, G6 is connected to an output clock gate control signal line QRD for operation from right to left. The output of the transmission gate G7, G8 is connected to a feedback output QRF for operation from left to right. The gate of the transistor M8 is connected to a feedback input for operation in either direction. The output of the inverter M1, M2 is connected to left and right outputs Q1 and to one of the gates of the transistor T10. The other gates of the transistor T15 are connected to an input D1L from the left and to an input D1R from the right.

Line D carries input clock gate control signals from the left or right and line F carries feedback input signals from the left or right in accordance with the current direction of operation.

When the direction control signal L is high, operation is from left to right. The transmission gates G1, G2 and G3, G4 are conductive whereas the transmission gates G5, G6 and G7, G8 are in their high impedance state. Thus, the gate control signal is passed to the right via the transmission gate G3, G4 and the line QLD and the feedback signal is passed to the left via transmission gate G1, G2 and the line QLF. Conversely, when the direction control signal L is low, operation is from right to left. The transmission gates are in their opposite states so that the gate control signal is pased to the left via the gate G5, G6 and the line QRD and the feedback signal is passed to the right via the transmission gate G7, G8 and the line QRF.

The triple gate transistor T10 ensures that the latch operating around the inverter M1, M2 is unlocked by the signals D1L or D1R whenever the stages on either side are activated. This allows each stage to operate in a bi-directional fashion because each can anticipate a clock gate control signal from the left or right and respond appropriately.

Figure 17:
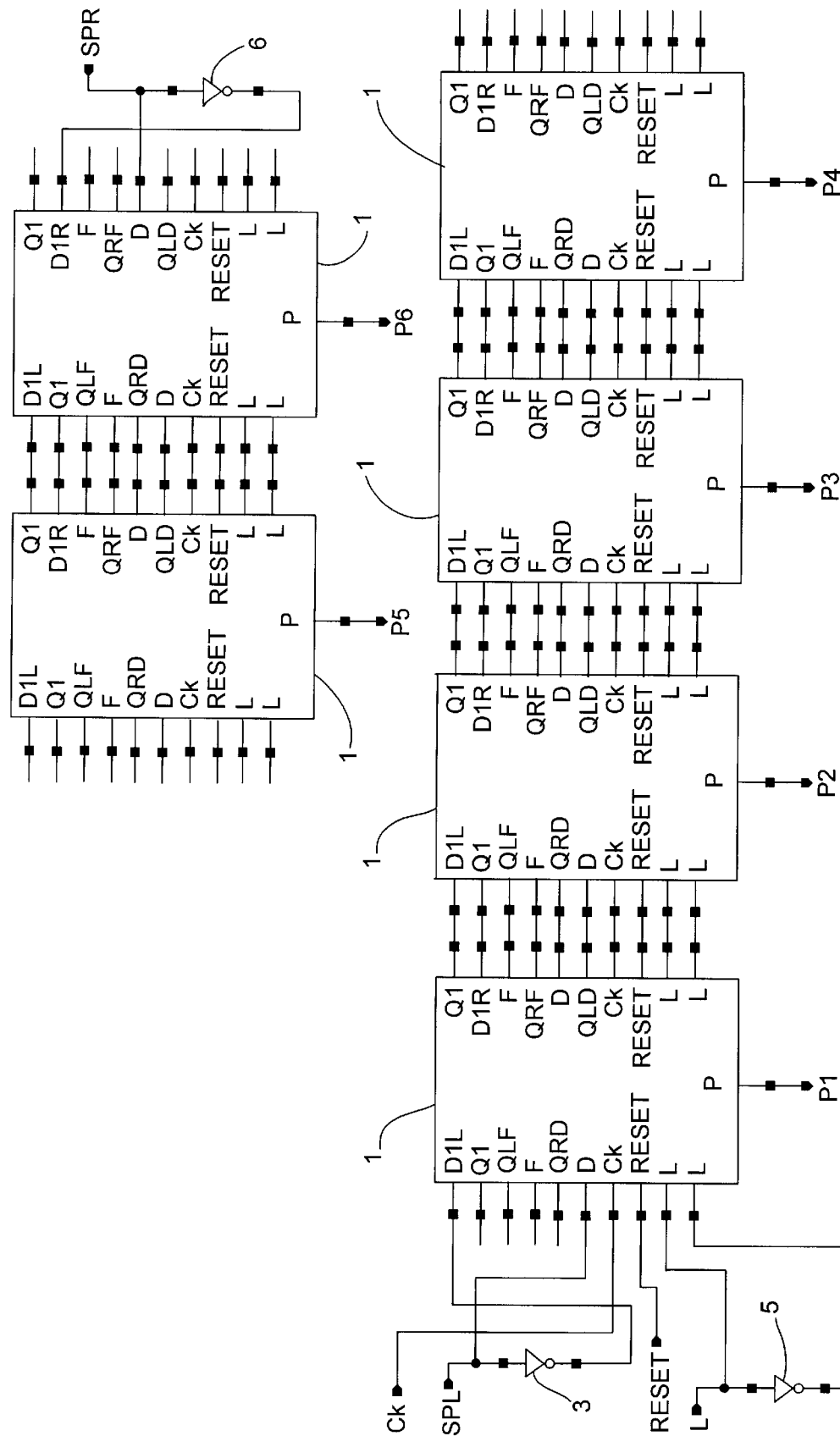
FIG. 17 is a block diagram of a clock pulse generator whose stages are illustrated in FIG. 16.

FIG. 17 illustrates a clock pulse generator formed by six stages 1 of the type shown in FIG. 16. In addition to the inverter 3 described hereinbefore, an inverter 5 is provided to generate the complementary direction control signal L− from the direction control signal L. Also, left or right start pulses SPL or SPR may be provided depending on the direction of operation and an inverter 6 is provided for operation from the right so as to generate the appropriate D1R.

Figure 18:
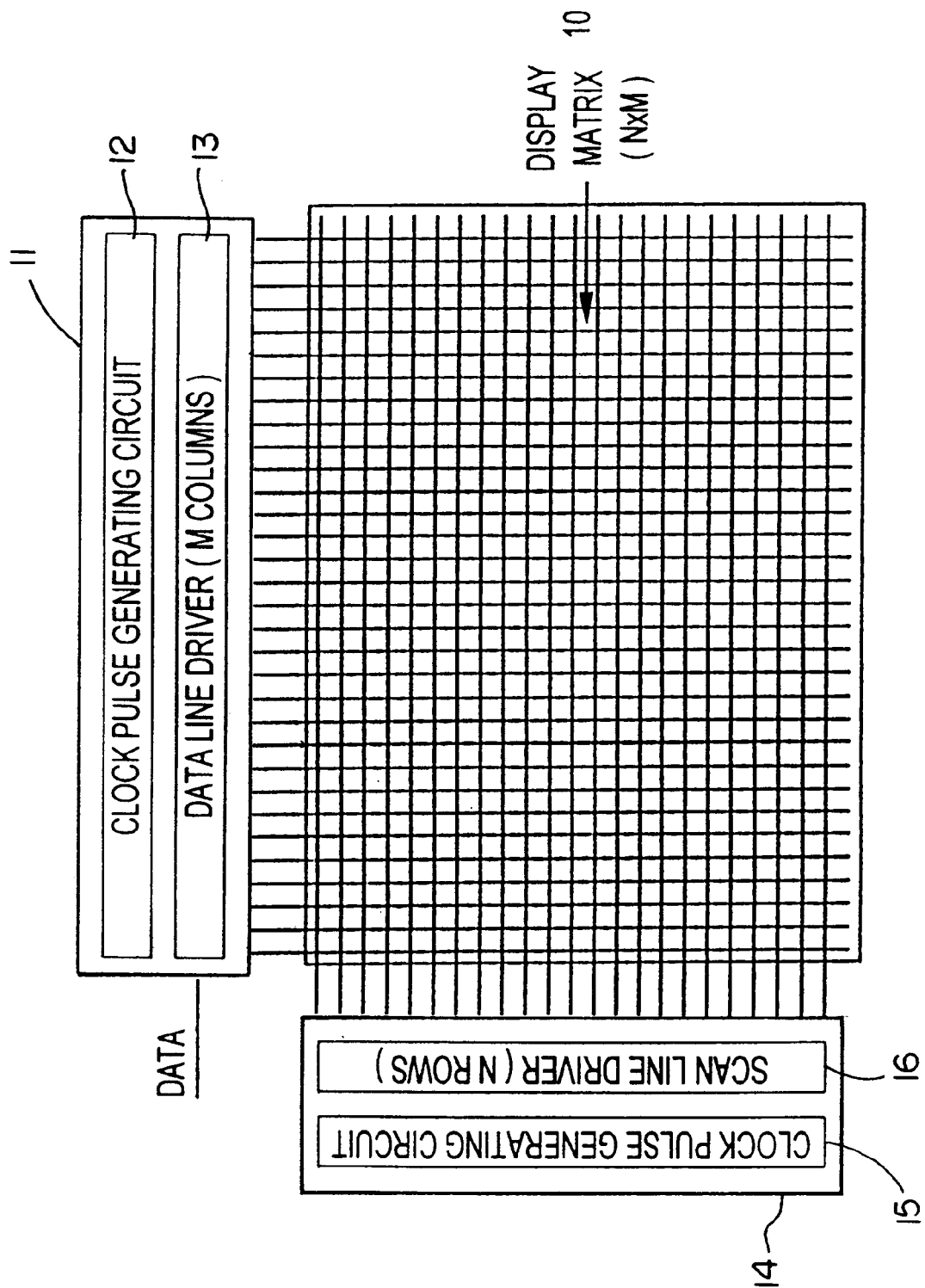
FIG. 18 is a block schematic diagram of a spatial light modulator constituting an embodiment of the invention.

FIG. 18 illustrates a display comprising a display matrix 10 of N rows by M columns of picture elements (pixels), for instance in the form of a spatial light modulator comprising a liquid crystal device. The display further comprises an address signal generator 11 comprising a clock pulse generating circuit 12 and a set of data line drivers 13. The clock pulse generating circuit 12 comprises a generator of any of the types described hereinbefore and illustrated in FIGS. 4 to 17. A scan signal generator 14 supplies scan signals to the rows of pixels and comprises a clock pulse generating circuit 15 and a set of scan line drivers 16. The clock pulse generating circuit 15 comprises a generator of any of the types described hereinbefore and illustrated In FIGS. 4 to 17. The clock pulse generating circuits generate clock pulses at pixel data rate for the circuit 12 and at line data rate for the circuit 15.

What is claimed is:

1. A clock pulse generator comprising a clock input and N stages where N is greater than three, each ith one of the stages comprising a transmission gate arranged to pass a clock pulse from the clock input to an output of the transmission gate in response to a control signal from the (i−1)th stage and a control signal generating circuit, operatively coupled to the (i−1)th stage and the (i+1)th stage and the control signals produced thereby, for supplying a control signal to the (i+1)th stage when the control signal from the (i−1)th stage and the clock pulse from the transmission gate have ended and for ending the control signal to the (i+1)th stage when the (i+1)th stage produces a control signal, where 1<i<N.

2. The clock pulse generator as claimed in claim 1, in which each ith stage comprises a switching arrangement for selectively causing the transmission gate to be controlled by a control signal from the (i+1)th stage and the control signal generating circuit to supply the control signal to the (i−1)th stage when the control signal from the (i+1)th stage and the clock pulse from the transmission gate have ended and to end the control signal to the (i−1)th stage when the (i−1)th stage produces a control signal.

3. The clock pulse generator as claimed in claim 2, in which the switching arrangement comprises a plurality of further transmission gates connected to the output of the control signal generating circuit and having control inputs for receiving direction control signals.

4. The clock pulse generator as claimed in claim 1, in which at least one of the transmission gate outputs constitute outputs of the clock pulse generator.

5. The clock pulse generator as claimed in claim 1, in which at least one of the control signals or the complements thereof constitute output signals of the clock pulse generator.

6. The clock pulse generator as claimed in claim 1, in which the transmission gates have inputs connected to the clock input.

7. The clock pulse generator as claimed in claim 1, in which each of the transmission gates comprises first and second metal-oxide-silicon field effect transistors of opposite conductivity types whose source-drain paths are connected in antiparallel.

8. The clock pulse generator as claimed in claim 7, in which the gate of the second transistor is connected to the output of an inverter whose input ts connected to the gate of the first transistor for receiving the control signal.

9. The clock pulse generator as claimed in claim 1, in which the control signal generating circuit of each ith stage comprises third, fourth and fifth metal-oxide-silicon field effect transistors and a metal-oxide-silicon field effect transistor arrangement, the third and fourth transistors being of opposite conductivity types and being connected in series between first and second supply inputs with the gate of the third transistor being connected to the control signal generating circuit of the (i−1)th stage and the gate of the fourth transistor being connected to the output of the transmission gate, the fifth transistor and the transistor arrangement being of opposite conductivity types and being connected in series between the first and second supply inputs with the gate of the fifth transistor being connected to the control signal generating circuit of the (i+1)th stage, a first control electrode of the transistor arrangement being connected to the connection between the third and fourth transistors, and the second control electrode of the transistor arrangement being connected to the output of the transmission gate.

10. The clock pulse generator as claimed in claim 9, in which the gate of the fourth transistor and the second control electrode of the transistor arrangement are connected to the output of the transmission gate via an inverter.

11. The clock pulse generator as claimed in claim 1, in which the transmission gate outputs are provided with pull-up or pull-down transistors.

12. The clock pulse generator as claimed in claim 11, in which each of the transmission gates comprises first and second metal-oxide-silicon field effect transistors of opposite conductivity types whose source-drain path are connected in antiparallel;
  in which the gate of the second transistor is connected to the output of an inverter whose input is connected to the gate of the first transistor for receiving the control signal; and
  in which each of the pull-up or pull-down transistors has a control electrode connected to the input or output of the inverter.

13. The clock pulse generator as claimed in claim 1, in which each of the stages has a control signal input for receiving the control signal from the preceding stage, the control signal input being provided with pull-up or pull-down arrangements.

14. The clock pulse generator as claimed in claim 13, in which each of the transmission gates comprises first and second metal-oxide-silicon field effect transistors of opposite conductivity types whose source-drain paths are connected in antiparallel;
  in which the gate of the second transistor is connected to the output of an inverter whose input is connected to the gate of the first transistor for receiving the control signal; and
  in which each of the pull-up or pull-down arrangements comprises a transistor arrangement having a first control electrode connected to the output of the inverter and a second control electrode connected to the output of the inverter of the preceding stage.

15. The clock pulse generator as claimed in claim 1, in which each of the stages has a resetting circuit for resetting the stage in response to a reset signal.

16. The clock pulse generator as claimed in claim 14, in which each of the stages has a resetting circuit for resetting the stage in response to a reset signal; and in which each of the stages has a control signal input for receiving the control signal from the preceding stage and the resetting circuit comprises a pull-up or pull-down transistor connected to the control signal input for resetting the logic state thereat.

17. The clock pulse generator as claimed in claim 1, further comprising a CMOS integrated circuit.

18. A spatial light modulator comprising a clock generator, the clock pulse generator comprising a clock input and N stages where N is greater than three, each ith one of the stages comprising a transmission gate arranged to pass a clock pulse from the clock input to an output of the transmission gate in response to a control signal from the (i−1)th stage and a control signal generating circuit, operatively coupled to the (i−1)th stage and the (i+1)th stage and the control signals produced thereby, for supplying a control signal to the (i+1)th stage when the control signal from the (i−1)th stage and the clock pulse from the transmission gate have ended and for ending the control signal to the (i+1)th stage when the (i+1)th stage produces a control signal, where 1<i<N.

19. The spatial light modulator as claimed in claim 18, further comprising a liquid crystal device.

20. A display comprising a spatial light modulator having a clock pulse generator, the clock pulse generator comprising a clock input and N stages where N is greater than three, each ith one of the stages comprising a transmission gate arranged to pass a clock pulse from the clock input to an output of the transmission gate in response to a control signal from the (i−1)th stage and a control signal generating circuit, operatively coupled to the (i−1)th stage and the (i+1)th stage and the control signals produced thereby, for supplying a control signal to the (i+1)th stage when the control signal from the (i−1)th stage and the clock pulse from the transmission gate have ended and for ending the control signal to the (i+1)th stage when the (i+1)th stage produces a control signal, where 1<i<N.

21. The display comprising the spatial light modulator as claimed in claim 20, the spatial light modulator further comprising a liquid crystal device.

* * * * *